United States Patent
Wang

(10) Patent No.: US 11,569,220 B2
(45) Date of Patent: Jan. 31, 2023

(54) ELECTROSTATIC DISCHARGE PROTECTION DEVICE AND METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventor: Wen-Tai Wang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 477 days.

(21) Appl. No.: 16/726,829

(22) Filed: Dec. 25, 2019

(65) Prior Publication Data

US 2021/0050341 A1  Feb. 18, 2021

(30) Foreign Application Priority Data

Aug. 12, 2019 (TW) ................. 108128626

(51) Int. Cl.
  *H02H 9/04* (2006.01)
  *H01L 27/02* (2006.01)
  *H01L 29/861* (2006.01)

(52) U.S. Cl.
  CPC ........ *H01L 27/0248* (2013.01); *H01L 29/861* (2013.01); *H02H 9/044* (2013.01); *H02H 9/046* (2013.01)

(58) Field of Classification Search
  CPC ........ H02H 9/044; H02H 9/046; H02H 9/043; H02H 9/042; H02H 9/041; H02H 9/04
  See application file for complete search history.

(56) References Cited

U.S. PATENT DOCUMENTS

| | | | | |
|---|---|---|---|---|
| 5,708,550 | A * | 1/1998 | Avery | H01L 27/0251 361/111 |
| 2004/0141269 | A1* | 7/2004 | Kitagawa | H01L 27/0251 361/56 |
| 2012/0081821 | A1* | 4/2012 | Li | H02H 9/046 361/56 |
| 2014/0268448 | A1* | 9/2014 | Tseng | H01L 25/0657 438/109 |

* cited by examiner

*Primary Examiner* — Nguyen Tran
(74) *Attorney, Agent, or Firm* — CKC & Partners Co., LLC

(57) ABSTRACT

An electrostatic discharge (ESD) protection device includes a first clamping circuit, a second clamping circuit, and a diode circuit. The first clamping circuit is coupled between a first power rail and a second power rail. The second clamping circuit is coupled between a third power rail and the second power rail. The diode circuit is configured to steer an ESD current from an input/output pad to at least one of the first clamping circuit or the third power rail. The first power rail receives a first voltage, the second power rail receives a second voltage, the third power rail receives a third voltage, the third voltage is higher than the first voltage, and the first voltage is higher than the second voltage.

19 Claims, 6 Drawing Sheets

ELECTROSTATIC DISCHARGE PROTECTION DEVICE AND METHOD

PRIORITY CLAIM AND CROSS-REFERENCE

The present application claims priority to Taiwan Application Serial Number 108128626, filed Aug. 12, 2019, which is herein incorporated by reference.

BACKGROUND

Field of Invention

The present invention relates to an electrostatic discharge (ESD) protection device, and particularly to ESD protection devices and methods using intermediate voltages.

Description of Related Art

In general, integrated circuits are implemented by one or more transistors. The sizes of the transistors get smaller with development of the manufacturing process. In order to prevent damages due to excessive voltage stress resulted from electrostatic discharge, ESD protection circuits are usually used to protect integrated circuits from electrostatic discharge. In the current technology, the ESD protection circuits are all implemented by input/output (I/O) transistors in the concern of voltage endurance. In this manner, the internal resistance of the discharge path in the ESD protection circuit may be higher, reducing the performance of the ESD protection circuit.

SUMMARY

To address the above described problems, some aspects of the present disclosure provide an electrostatic discharge protection device comprising a first clamping circuit, a second clamping circuit, and a diode circuit. The first clamping circuit is coupled between a first power rail and a second power rail. The second clamping circuit is coupled between a third power rail and the second power rail. The diode circuit is configured to steer an electrostatic discharge current from an input/output pad to at least one of the first clamping circuit or the third power rail. The first power rail receives a first voltage, the second power rail receives a second voltage, the third power rail receives a third voltage, the third voltage is higher than the first voltage, and the first voltage is higher than the second voltage.

In some embodiments, the first clamping circuit is implemented by a plurality of core transistors, and the second clamping circuit is implemented by a plurality of input/output transistors or a plurality of stacked core transistors.

In some embodiments, the first voltage is ⅔ to ¾ of the third voltage.

In some embodiments, a discharge capability of the first clamping circuit is higher than a discharge capability of the second clamping circuit.

In some embodiments, an internal resistance of the first clamping circuit is lower than an internal resistance of the second clamping circuit.

In some embodiments, the diode circuit comprises a first diode, a second diode, and a third diode. An anode of the first diode is coupled to the input/output pad, and a cathode of the first diode is coupled to the first power rail. An anode of the second diode is coupled to the first power rail, and a cathode of the second diode is coupled to the third power rail. An anode of the third diode is coupled to the second power rail, and a cathode of the third diode is coupled to the input/output pad.

In some embodiments, the electrostatic discharge current is steered to the first clamping circuit via the first diode, or steered to the third power rail via the first diode and the second diode in sequence.

In some embodiments, the diode circuit comprises a first diode, a second diode, and a third diode. An anode of the first diode is coupled to the input/output pad, and a cathode of the first diode is coupled to the first power rail. An anode of the second diode is coupled to the input/output pad, and a cathode of the second diode is coupled to the third power rail. An anode of the third diode is coupled to the second power rail, and a cathode of the third diode is coupled to the input/output pad.

In some embodiments, the electrostatic discharge current is steered to the first clamping circuit via the first diode, or steered to the third power rail via the second diode.

In some embodiments, the diode circuit comprises a first diode, a second diode, and a third diode. An anode of the first diode is coupled to the input/output pad, and a cathode of the first diode is coupled to the first power rail. An anode of the second diode is coupled to the second power rail, and a cathode of the second diode is coupled to the third power rail. An anode of the third diode is coupled to the second power rail, and a cathode of the third diode is coupled to the input/output pad.

In some embodiments, the electrostatic discharge current is steered to the first clamping circuit via the first diode, or steered to the third power rail via the first diode, the first clamping circuit, and the second diode in sequence.

Some aspects of the present disclosure provide a method for electrostatic discharge protection, comprising the following operations: steering, via a diode circuit, an electrostatic discharge current from an input/output pad to at least one of a first clamping circuit or a first power rail; and discharging the electrostatic discharge current via the first clamping circuit, wherein the first clamping circuit is coupled between a second power rail and a third power rail, a second clamping circuit is coupled between the first power rail and the second power rail, the first power rail receiving a first voltage, the second power rail receiving a second voltage, the third power rail receiving a third voltage, the first voltage higher than the third voltage, and the third voltage higher than the second voltage.

In sum, the electrostatic discharge protection device and the method for electrostatic discharge protection provided by some embodiments of the present application may provide a set of clamping circuits having lower working voltage and lower internal resistance, so as to enhance the performance of the electrostatic discharge protection devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
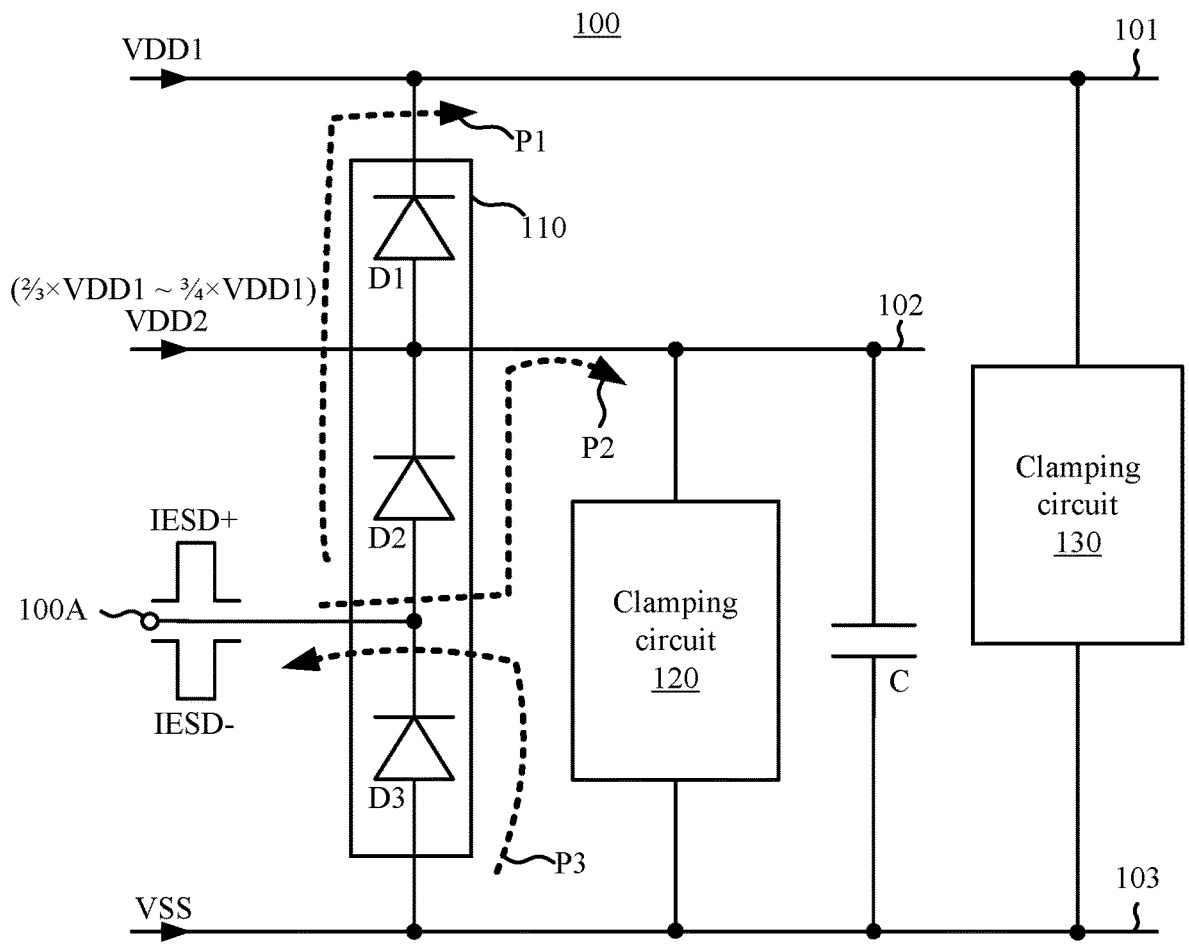
FIG. 1 is a schematic diagram illustrating an electrostatic discharge (ESD) protection device according to some embodiments of the present application.

While the following description are made in detail based on embodiments and the accompanying drawings, the scope of the present application is not limited to the embodiments provided, nor the description of structural operations is intended to limit the order of performing thereof. The scope of the present application encompasses both the structures reconstructed from the components and the devices with equivalent effects.

Further, the term "coupled" or "connected" used herein may refer to two or more components which are in physically or electrically direct contact with each other, or which are in physically or electrically indirect contact, and may also refer to two or more co-operating or acting components.

It may be appreciated that the terms "first," "second," and "third" used herein are for describing various components. However, those components should not be limited by such terms. Such vocabularies are merely used to identify each of the components. Therefore, a first component hereinafter may also be referred to as a second component without departing from the intention of the preset disclosure.

In the present disclosure, the term "circuitry" may generally refer to a single system formed from one or more circuits. The term "circuit" may generally refer to an object connected by one or more transistors and/or one or more active/passive components in a certain matter for processing signals.

Regarding the terms "about," "approximately," or "substantially" used herein, in general they indicate a deviation or range within about twenty percent (20%) of a value, preferably within about ten percent (10%) of the value, and more preferably within about five percent (5%) of the value. If there is no explicit description in the context, the values referred are all deemed as approximate values, i.e., as the deviation or range indicated by the terms "about," "approximately," or "substantially."

For the ease of understanding, the same reference numerals are designated to the like components in the figures below.

FIG. 1 is a schematic diagram illustrating an electrostatic discharge (ESD) protection device 100 according to some embodiments of the present application. In some embodiments, the ESD protection device 100 may be utilized in an input/output (I/O) interface in a chip or integrated circuit, so as to protect the internal components of the chip or integrated circuit from ESD events of an I/O pad 100A.

In some embodiments, the ESD protection device 100 comprises a diode circuit 110, a clamping circuit 120, and a clamping circuit 130. The diode circuit 110 is coupled to power rails 101, 102, and 103. The diode circuit 110 is configured to steer the ESD current, resulted from the ESD events on the I/O pad 100A, to at least one of the clamping circuit 120 and/or the power rail 101. For example, the diode circuit 110 comprises multiple diodes D1-D3. The anode of the diode D1 is coupled to the power rail 102, and the cathode of the diode D1 is coupled to the power rail 101. The anode of the diode D2 is coupled to the I/O pad 100A, and the cathode of the diode D2 is coupled to the power rail 102. The anode of the diode D3 is coupled to the power rail 103, and the cathode of the diode D3 is coupled to the I/O pad 100A. When an ESD event happens, a positive ESD current IESD+ may appear on the I/O pad 100A. This positive ESD current IESD+ may be steered to the power rail 102 and the clamping circuit 120 via the diode D2 (i.e., in the path P2), or steered to the power rail 101 (as well as the clamping circuit 130) via the diodes D2 and D1 in sequence (i.e., in the path P1). Alternatively, a negative ESD current IESD– may appear on the I/O pad 100A when an ESD event happens. Such negative ESD current IESD– may be steered to the power rail 103 via the diode D3 (i.e., in the path P3).

As shown in FIG. 1, the power rail 101 receives a voltage VDD1, the power rail 102 receives a voltage VDD2, and the power rail 103 receives a voltage VSS. In some embodiments, the voltage VDD1 is higher than the voltage VDD2, and the voltage VDD2 is higher than the voltage VSS.

The clamping circuit 120 is coupled between the power rail 102 and the power rail 103, and the clamping circuit 130 is coupled between the power rail 101 and the power rail 103. In response to an ESD event from the I/O pad 100A, at least one of the clamping circuit 120 and/or the clamping circuit 130 would be on and provide at least one discharge path. As such, the positive ESD current IESD+ resulted from the ESD event may be discharged through at least one of the clamping circuit 120 or 130, so as to prevent accidentally damaging other components in the chip or integrated circuit.

In some embodiments, the discharge capability (corresponding to the current driving capability) of the clamping circuit 120 is higher than the discharge capability of the clamping circuit 130. In some embodiments, the internal resistance of the clamping circuit 120 is lower than the internal resistance of the clamping circuit 130. In some embodiments, the clamping circuit 120 may be implemented by core transistors, and the clamping circuit 130 may be implemented by I/O transistors. In general, core transistors are configured for implementing the primary circuit portion of a chip, while I/O transistors, which have higher voltage endurance, are usually configured for implementing I/O interface circuits. The threshold voltage of a core transistor is lower than the threshold voltage of an I/O transistor. Therefore, the clamping circuit 120 can be turned on under a lower working voltage to provide a discharge path. Furthermore, the discharge path provided by the clamping circuit 120 implemented by core transistors, in contrast to I/O transistors, has a lower internal resistance. As such, when a positive ESD current IESD+ exists, the clamping circuit 120 can be turned on faster and discharge this positive ESD current IESD+, so as to provide ESD protection. In other words, by configuring the clamping circuit 120, the performance of the ESD protection device 100 may be further improved.

In some embodiments, the working voltage of the clamping circuit 120 (e.g., the voltage VDD2) is lower than the working voltage of the clamping circuit 130 (e.g., the voltage VDD1). In some embodiments, the voltage VDD2 may be lower than the voltage VDD1 and lower than or equal to the nominal core voltage of the core transistor. In some embodiments, the voltage VDD2 is about ⅔ to ¾ of the voltage VDD1. In some embodiments, the voltage VDD2 may be lower than ⅔ of the voltage VDD1. The ratios described above are for illustration, and the present application is not limited by these ratios.

In some related applications, I/O transistors or stacked core transistors are used for implementing the ESD protection devices in the concern of voltage endurance. However, the circuit implemented by I/O transistors or stacked core transistors has a higher internal resistance due to the higher threshold voltage and/or the stacked circuit structure thereof. Consequently, the discharge speed of the positive ESD current IESD+ and the negative ESD current IESD− is overly unbalanced, reducing the performance of ESD protection. In contrast to the above-mentioned technique, the internal resistance of the discharge path may be effectively lower by configuring the clamping circuit 120, so as to further balance the discharge speed of the positive ESD current IESD+ and the negative ESD current IESD−.

In some embodiments, the ESD protection device 100 may further comprise a capacitor C. The capacitor C is coupled between the power rail 102 and the power rail 103 to provide a supplementary path for discharging the positive ESD current IESD+.

Figure 2:
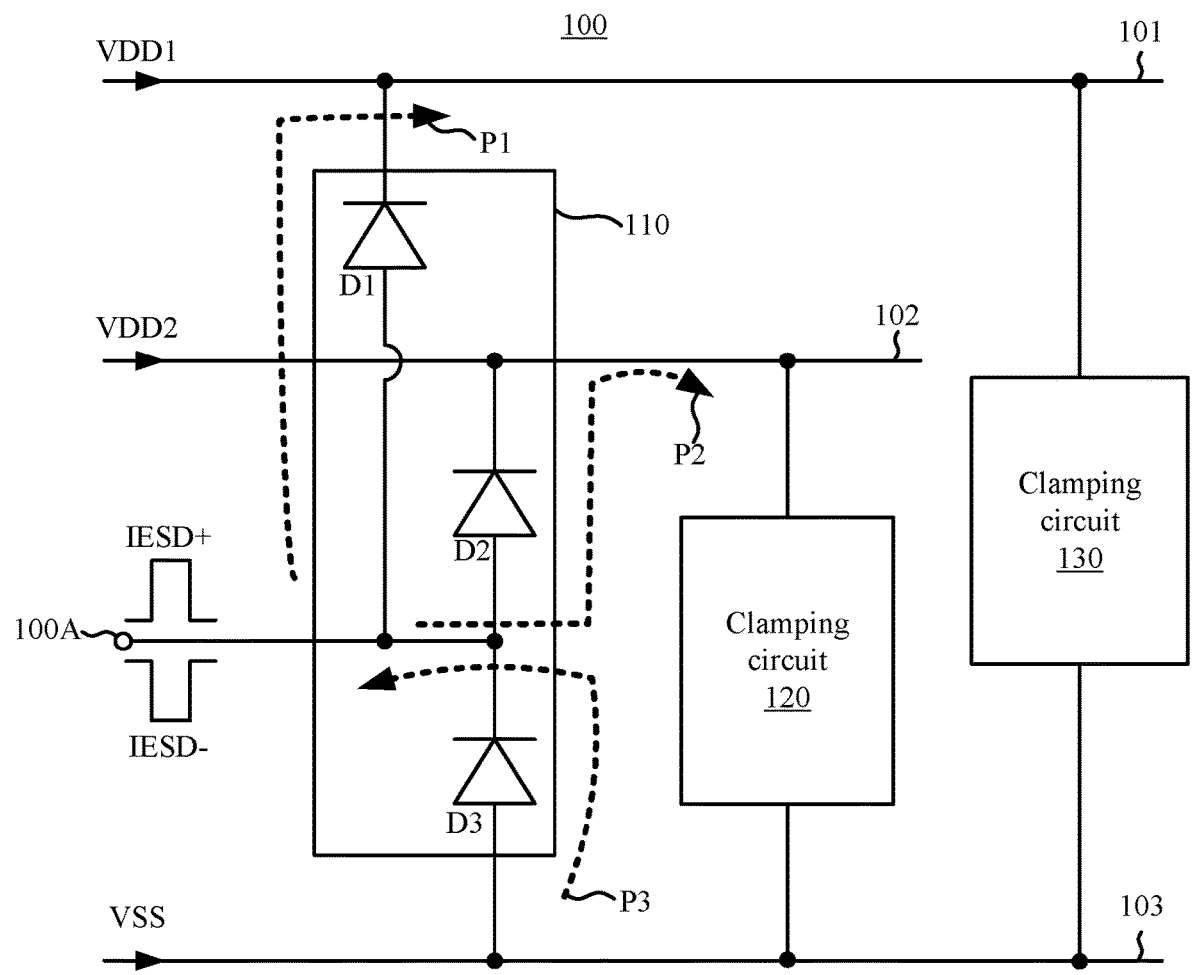
FIG. 2 is a schematic diagram illustrating an ESD protection device according to some embodiments of the present application.

FIG. 2 is a schematic diagram illustrating an ESD protection device 100 according to some embodiments of the present application. In contrast to FIG. 1, the diode D1 is coupled between the I/O pad 100A and the power rail 101 in this example, wherein the anode of the diode D1 is coupled to the I/O pad 100A, and the cathode of the diode D1 is coupled to the power rail 101. In other words, in this example, the I/O pad 100A may be coupled to the power rail 101 without via the diode D2. As such, when the positive ESD current IESD+ exists, this positive ESD current IESD+ may be directly steered to the power rail 101 (and the clamping circuit 130) via the diode D1 (i.e., in the path P1), or directly steered to the power rail 102 and the clamping circuit 120 via the diode D2 (i.e., in the path P2).

Figure 3:
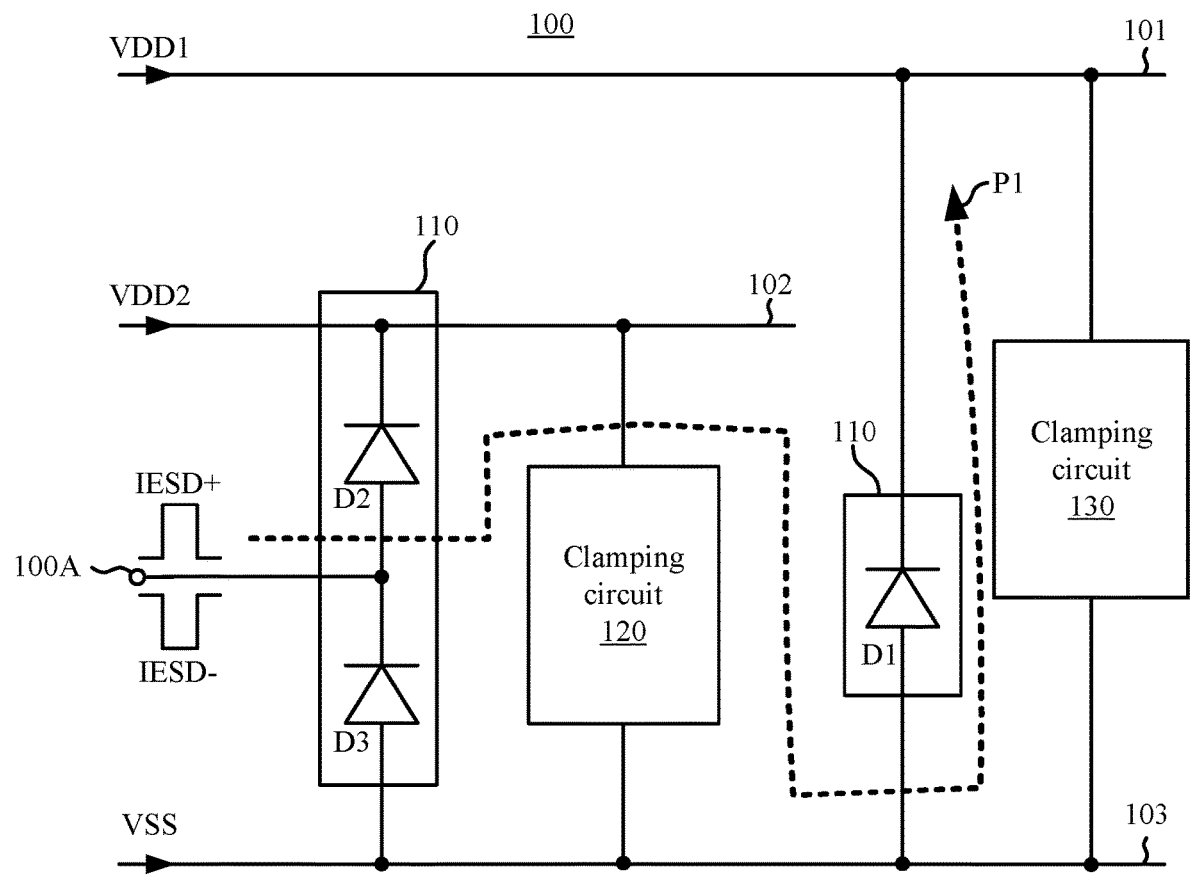
FIG. 3 is a schematic diagram illustrating an ESD protection device according to some embodiments of the present application.

FIG. 3 is a schematic diagram illustrating an ESD protection device 100 according to some embodiments of the present application. In contrast to FIG. 1, the diode D1 is coupled between the power rail 103 and the power rail 101 in this example, wherein the anode of the diode D1 is coupled to the power rail 103, and the cathode of the diode D1 is coupled to the power rail 101. As such, when the positive ESD current IESD+ exists, this positive ESD current IESD+ may further be steered to the power rail 101 (and the clamping circuit 130) via the diode D2, the clamping circuit 120, and the diode D1 in sequence (i.e., in the path P1), in addition to the above-described path P2.

Figure 4:
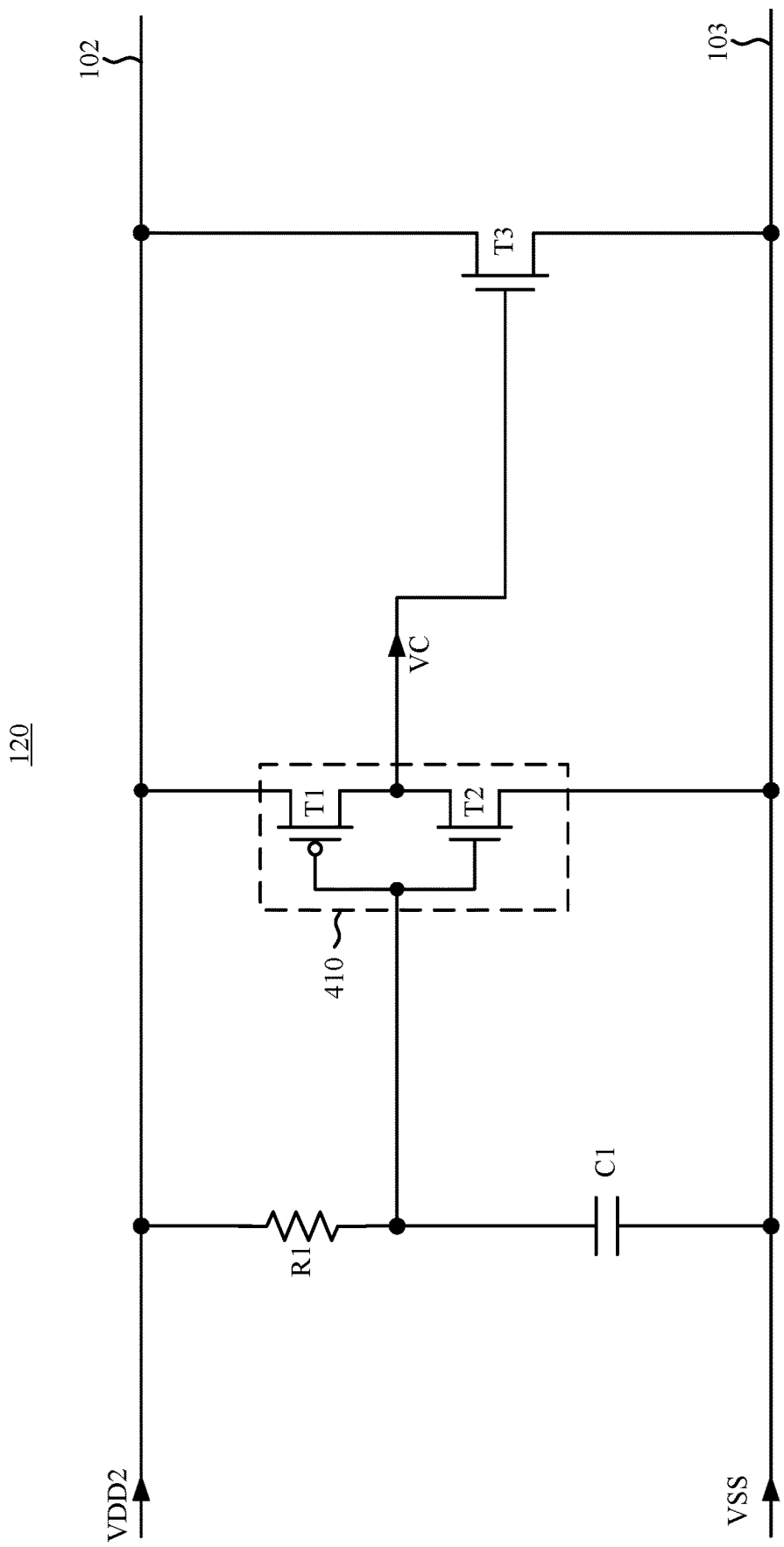
FIG. 4 is a schematic diagram illustrating a clamping circuit according to some embodiments of the present application.

FIG. 4 is a schematic diagram illustrating a clamping circuit 120 according to some embodiments of the present application. In this example, transistors T1-T3 are implemented by core transistors.

The clamping circuit 120 comprises a resistor R1, a capacitor C1, and the transistors T1-T3. The first end of the resistor R1 is coupled to the power rail 102, and the second end of the resistor R1 is coupled to the first end of the capacitor C1. The second end of the capacitor C1 is coupled to the power rail 103. The transistor T1 and the transistor T2 operate as an inverter 410. The first end of the transistor T1 is coupled to the power rail 102, the second end of the transistor T1 coupled to the first end of the transistor T2, and the control ends of the transistor T1 and the transistor T2 are coupled to the first end of capacitor C1. The second end of the transistor T2 is coupled to the power rail 103. The transistor T3 is configured to provide a discharge path for the positive ESD current IESD+. The first end of the transistor T3 is coupled to the power rail 102, the second end of the transistor T3 coupled to the power rail 103, and the control end of the transistor T3 is coupled to the second end of the transistor T1.

When the positive ESD current IESD+ exists, the first end of the capacitor C1 would couple to the power rail 103 to pull down the potential of the first end of the capacitor C1 to a lower voltage VSS. The inverter 410 outputs a control signal VC having the voltage VDD2 accordingly. In response to this control signal VC, the transistor T3 is turned on to discharge the positive ESD current IESD+.

Figure 5:
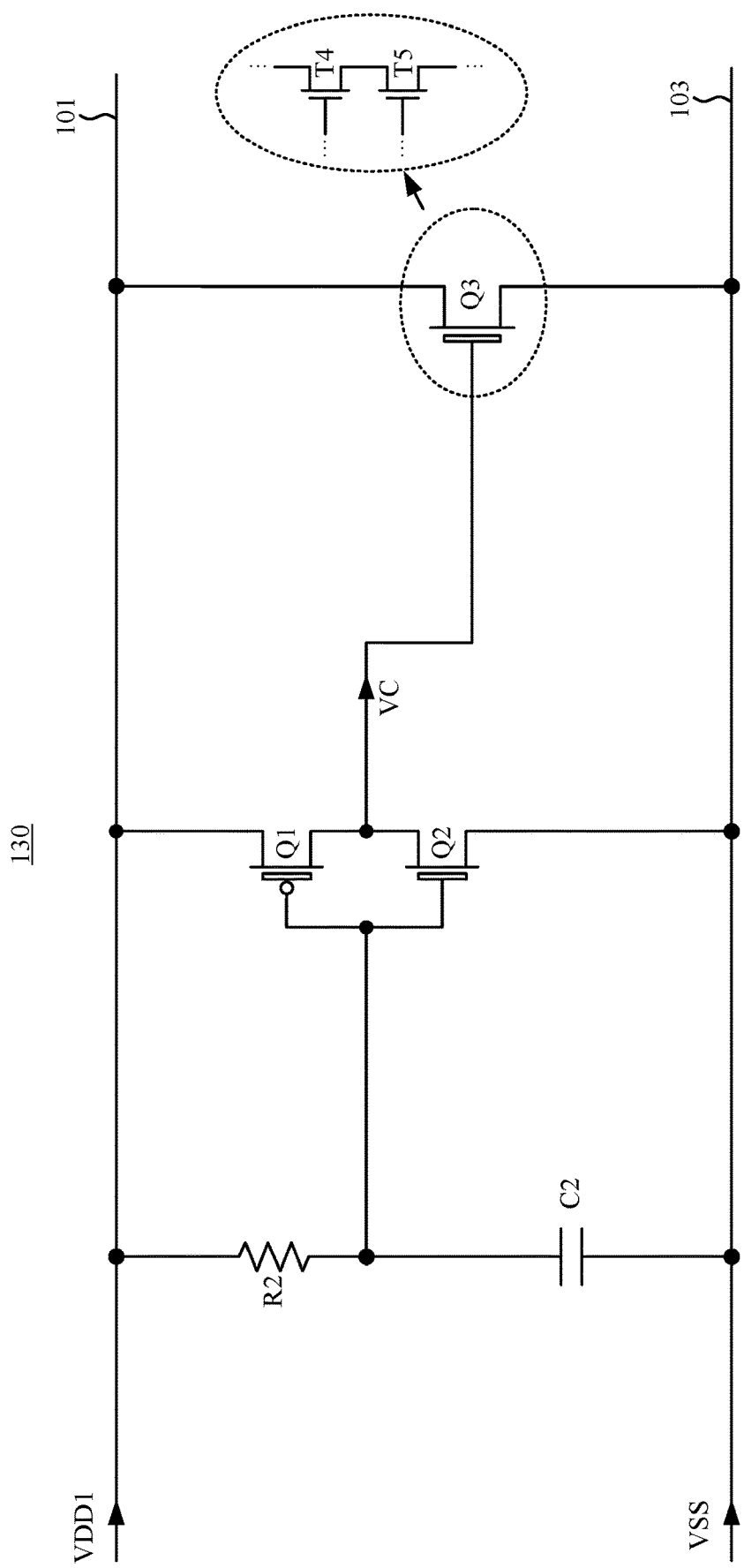
FIG. 5 is a schematic diagram illustrating a clamping circuit according to some embodiments of the present application.

FIG. 5 is a schematic diagram illustrating a clamping circuit 130 according to some embodiments of the present application. In this example, transistors Q1-Q3 are implemented by I/O transistors.

The clamping circuit 130 comprises a resistor R2, a capacitor C2, and the transistors Q1-Q3. In contrast to the clamping circuit 120, the clamping circuit 130 is coupled to the power rail 101 instead of the power rail 102, and the rest of the circuit structure of the clamping circuit 130 is similar to that of the clamping circuit 120, thus is not repeated here.

The circuit configuration described above in relation to the clamping circuit 120 and the clamping circuit 130 is for illustration, and the present application is not limited by the same. For instance, in other embodiments, the clamping circuit 120 and the clamping circuit 130 may also be implemented by silicon controlled rectifier circuits. Alternatively, as shown in FIG. 5, each of the transistors Q1-Q3 may be implemented by a plurality of stacked core transistors in other embodiments. Take the transistor Q3 as an example, the transistor Q3 may instead be implemented by two or more core transistors T4 and T5, wherein the core transistors T4 and T5 are stacked with each other, equivalently operated as a single transistor Q3.

The amounts of the components (the diode, the capacitor, the transistor, etc.) in the embodiments are described above for illustration, and the amounts of the components in the ESD protection device 100 may be adjusted according to various embodiments.

Figure 6:
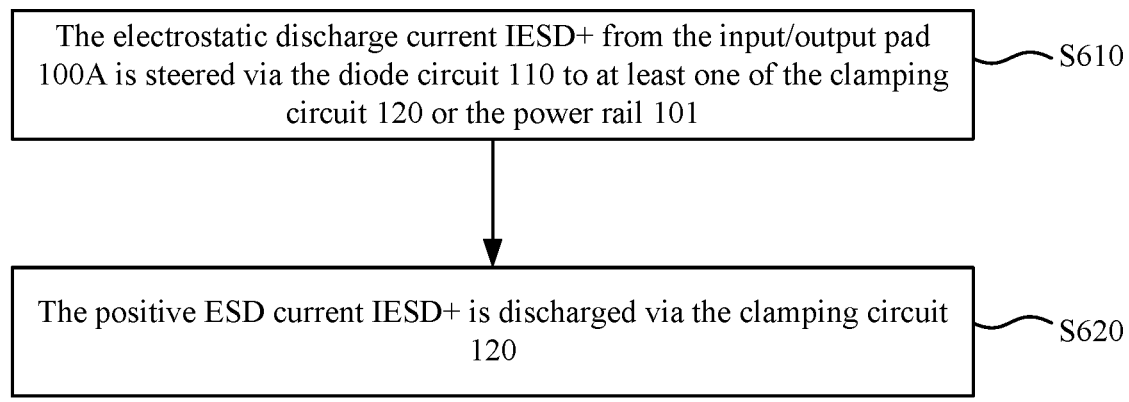
FIG. 6 is a flowchart of a method for ESD protection according to some embodiments of the present application.

FIG. 6 is a flowchart of a method 600 for ESD protection according to some embodiments of the present application.

At operation S610, the electrostatic discharge current IESD+ from the input/output pad 100A is steered via the diode circuit 110 to at least one of the clamping circuit 120 or the power rail 101.

At operation S620, the positive ESD current IESD+ is discharged via the clamping circuit 120.

Description for the operation S610 and the operation S620 above may be referred to the embodiments in FIGS. 1-5 above and thus is not repeated here. The multiple operations of the method 600 for ESD protection described above are for illustration only, and are not necessarily performed in the illustrated order. Various operations of the method 600 for ESD protection may be appropriately added, replaced, omitted, or performed in a different order without departing from the execution manner and scope of various embodiments of the present application.

In sum, the ESD protection devices and methods for ESD protection provided by some embodiments of the present application may provide a set of clamping circuits having lower working voltages and lower internal resistance for enhancing the performance of the ESD protection devices.

Although the present application has been described above with reference to certain embodiments thereof, the present application is not limited in those embodiments. Those skilled in the art can make various modifications and variations to the embodiments without departing from the scope or spirit of the present application. Therefore, it is intended that the protection scope of the present application is defined by the following claims.

What is claimed is:

1. An electrostatic discharge (ESD) protection device, comprising:
   a first clamping circuit coupled between a first power rail and a second power rail;
   a second clamping circuit coupled between a third power rail and the second power rail, wherein the first clamping circuit and the second clamping circuit provide different discharge paths for an input/output pad, and the first clamping circuit is turned on faster than the second clamping circuit to discharge an electrostatic discharge current from the input/output pad; and
   a diode circuit configured to steer the electrostatic discharge current from the input/output pad to at least one of the first clamping circuit or the second clamping circuit, wherein the diode circuit comprises a first diode, wherein an anode of the first diode is coupled to the input/output pad, and a cathode of the first diode is coupled to the first power rail, wherein the ESD current is steered to the first clamping circuit via the first diode;
   wherein the first power rail receives a first voltage, the second power rail receives a second voltage, the third power rail receives a third voltage, the third voltage is higher than the first voltage, and the first voltage is higher than the second voltage.

2. The ESD protection device of claim 1, wherein the first clamping circuit is implemented by a plurality of core transistors, and the second clamping circuit is implemented by a plurality of input/output transistors or a plurality of stacked core transistors.

3. The ESD protection device of claim 1, wherein the first voltage is ⅔ to ¾ of the third voltage.

4. The ESD protection device of claim 1, wherein a discharge capability of the first clamping circuit is higher than a discharge capability of the second clamping circuit.

5. The ESD protection device of claim 1, wherein an internal resistance of the first clamping circuit is lower than an internal resistance of the second clamping circuit.

6. The ESD protection device of claim 1, wherein the diode circuit further comprises:
   a second diode, wherein an anode of the second diode is coupled to the first power rail, and a cathode of the second diode is coupled to the third power rail; and
   a third diode, wherein an anode of the third diode is coupled to the second power rail, and a cathode of the third diode is coupled to the input/output pad.

7. The ESD protection device of claim 6, wherein the ESD current is steered to the third power rail via the first diode and the second diode in sequence.

8. The ESD protection device of claim 1, wherein the diode circuit further comprises:
   a second diode, wherein an anode of the second diode is coupled to the input/output pad, and a cathode of the second diode is coupled to the third power rail; and
   a third diode, wherein an anode of the third diode is coupled to the second power rail, and a cathode of the third diode is coupled to the input/output pad.

9. The ESD protection device of claim 8, wherein the ESD current is steered to third power rail via the second diode.

10. The ESD protection device of claim 1, wherein the diode circuit further comprises:
    a second diode, wherein an anode of the second diode is coupled to the second power rail, and a cathode of the second diode is coupled to the third power rail; and
    a third diode, wherein an anode of the third diode is coupled to the second power rail, and a cathode of the third diode is coupled to the input/output pad.

11. The ESD protection device of claim 10, wherein the ESD current is steered to the third power rail via the first diode, the first clamping circuit, and the second diode in sequence.

12. A method for electrostatic discharge (ESD) protection, comprising:
    via a diode circuit, steering an ESD current from an input/output pad to at least one of a first clamping circuit or a second clamping circuit; and
    discharging the ESD current via the first clamping circuit,
    wherein the first clamping circuit is coupled between a second power rail and a third power rail, the second clamping circuit is coupled between a first power rail and the second power rail, the first power rail receiving a first voltage, the second power rail receiving a second voltage, the third power rail receiving a third voltage, the first voltage higher than the third voltage, the third voltage higher than the second voltage,
    wherein the first clamping circuit and the second clamping circuit provide different discharge paths for the ESD current from the input/output pad, and the first clamping circuit is turned on faster than the second clamping circuit to discharge the ESD current from the input/output pad,
    wherein the diode circuit comprises a first diode, wherein an anode of the first diode is coupled to the input/output pad, and a cathode of the first diode is coupled to the third power rail, wherein the ESD current is steered to the first clamping circuit via the first diode.

13. The method for ESD protection of claim 12, wherein the first clamping circuit is implemented by a plurality of core transistors, and the second clamping circuit is implemented by a plurality of input/output transistors or a plurality of stacked core transistors.

14. The method for ESD protection of claim 12, wherein the third voltage is ⅔ to ¾ of the first voltage.

15. The method for ESD protection of claim 12, wherein a discharge capability of the first clamping circuit is higher than a discharge capability of the second clamping circuit.

16. The method for ESD protection of claim 12, wherein an internal resistance of the first clamping circuit is lower than an internal resistance of the second clamping circuit.

17. The method for ESD protection of claim 12, wherein the diode circuit further comprises a second diode, and the steering the ESD current via the diode circuit comprises:
    steering the ESD current to the first power rail via the first diode and the second diode in sequence,
    wherein an anode of the second diode is coupled to the third power rail, and a cathode of the second diode is coupled to the first power rail.

18. The method for ESD protection of claim 12, wherein the diode circuit further comprises a second diode, and the steering the ESD current via the diode circuit comprises:
    steering the ESD current to the first power rail via the second diode,
    wherein an anode of the second diode is coupled to the input/output pad, and a cathode of the second diode is coupled to the first power rail.

19. The method for ESD protection of claim 12, wherein the diode circuit further comprises a second diode, and the steering the ESD current via the diode circuit comprises:
    steering the ESD current to the first power rail via the first diode, the first clamping circuit and the second diode in sequence, wherein an anode of the second diode is coupled to the second power rail, and a cathode of the second diode is coupled to the first power rail.

\* \* \* \* \*